United States Patent
Hong

(10) Patent No.: US 11,441,229 B2
(45) Date of Patent: Sep. 13, 2022

(54) METHOD FOR SELECTIVELY REMOVING NICKEL PLATINUM MATERIAL

(71) Applicant: ENTEGRIS, INC., Billerica, MA (US)

(72) Inventor: SeongJin Hong, Cheongju-si (KR)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/444,262

(22) Filed: Jun. 18, 2019

(65) Prior Publication Data
US 2020/0010959 A1    Jan. 9, 2020

Related U.S. Application Data

(60) Provisional application No. 62/694,595, filed on Jul. 6, 2018.

(51) Int. Cl.
C23F 1/30      (2006.01)
H01L 21/4757   (2006.01)
H01L 21/306    (2006.01)
H01L 21/3213   (2006.01)

(52) U.S. Cl.
CPC .......... *C23F 1/30* (2013.01); *H01L 21/30604* (2013.01); *H01L 21/30608* (2013.01); *H01L 21/30617* (2013.01); *H01L 21/32134* (2013.01); *H01L 21/47573* (2013.01)

(58) Field of Classification Search
None
See application file for complete search history.

(56) References Cited

U.S. PATENT DOCUMENTS

| | | | |
|---|---|---|---|
| 2014/0038348 A1 | 2/2014 | Kim | |
| 2014/0073130 A1 | 3/2014 | Hilscher | |
| 2015/0162213 A1 | 6/2015 | Chen | |
| 2016/0056054 A1* | 2/2016 | Takahashi | H01L 21/324 438/754 |

FOREIGN PATENT DOCUMENTS

| | | |
|---|---|---|
| JP | 2014189834 A | 10/2014 |
| TW | 201241158 A | 10/2012 |
| TW | 415174 B | 11/2013 |
| TW | 201447042 A | 12/2014 |
| WO | 2007064777 A3 | 12/2007 |
| WO | 2015130607 A1 | 9/2015 |
| WO | 2017205722 A1 | 11/2017 |

* cited by examiner

*Primary Examiner* — Stephanie P Duclair

(57) ABSTRACT

A method of selectively removing NiPt material from a microelectronic substrate, the method comprising contacting the NiPt material with an aqueous etching composition comprising:
  an oxidising agent;
  a strong acid; and
  a source of chloride.

11 Claims, 1 Drawing Sheet

| | Water (wt%) | $H_2SO_4$ (wt%) | MSA (wt%) | 70% $HNO_3$ (wt%) | APS (wt%) | 30% $H_2O_2$ (wt%) | $NH_4Cl$ (wt%) | 35% HCl (wt%) | IDA | Citric acid | Temp (°C) | Etch amount NiPt (10sec) | Etch amount NiPtSi (5min) | Etch amount TiN (5min) |
|---|---|---|---|---|---|---|---|---|---|---|---|---|---|---|
| 1 | 73.7 | | 10.5 | | | 10.5 | | 5.3 | | 0.01 | 40 | 160 | 20 | 5 |
| 2 (a) | 73.5 | | 10.6 | | | 10.6 | 5.3 | | | | 40 | 146 | 5 | 21.9 |
| 2 (b) | 73.5 | | 10.6 | | | 10.6 | 5.3 | | | | 25 | 150 | 2 | 2.3 |
| 3 (a) | 73.2 | | 10.5 | 0.5 | | 10.5 | 5.3 | | | | 40 | 146 | 0 | 20.5 |
| 3 (b) | 73.2 | | 10.5 | 0.5 | | 10.5 | 5.3 | | | | 25 | 150 | 1 | -2.1 |
| 4 | 44.3 | | | 6.0 | | 10.0 | 5.0 | 34.7 | | | 40 | 153 | 29 | 71.8 |
| 5 | 77.2 | 11.1 | | | 5.6 | | 5.6 | | 0.6 | | 50 | 54 | -8 | 0.05 |

TABLE 1

| | Water (wt%) | H$_2$SO$_4$ (wt%) | MSA (wt%) | 70% HNO$_3$ (wt%) | APS (wt%) | 30% H$_2$O$_2$ (wt%) | NH$_4$Cl (wt%) | 35% HCl (wt%) | IDA | Citric acid | Temp (°C) | NiPt (10sec) | NiPtSi (5min) | TiN (5min) |
|---|---|---|---|---|---|---|---|---|---|---|---|---|---|---|
| | | | | | | | | | | | | | Etch amount | |
| 1 | 73.7 | | 10.5 | | | 10.5 | | 5.3 | | 0.01 | 40 | 160 | 20 | 5 |
| 2 (a) | 73.5 | | 10.6 | | | 10.6 | 5.3 | | | | 40 | 146 | 5 | 21.9 |
| 2 (b) | 73.5 | | 10.6 | | | 10.6 | 5.3 | | | | 25 | 150 | 2 | 2.3 |
| 3 (a) | 73.2 | | 10.5 | 0.5 | | 10.5 | 5.3 | | | | 40 | 146 | 0 | 20.5 |
| 3 (b) | 73.2 | | 10.5 | 0.5 | | 10.5 | 5.3 | | | | 25 | 150 | 1 | -2.1 |
| 4 | 44.3 | | | 6.0 | | 10.0 | 5.0 | 34.7 | | | 40 | 153 | 29 | 71.8 |
| 5 | 77.2 | 11.1 | | | 5.6 | | 5.6 | | 0.6 | | 50 | 54 | -8 | 0.05 |

TABLE 1

METHOD FOR SELECTIVELY REMOVING NICKEL PLATINUM MATERIAL

TECHNICAL FIELD

This invention relates to methods and compositions for selectively removing material from microelectronic substrates. In particular, though not exclusively, the invention relates to methods and compositions for selectively removing Nickel Platinum (NiPt) material from microelectronic substrates.

BACKGROUND

There are various requirements in the semiconductor industry to etch or remove certain materials selectively at different times using a wet etching process.

It is essential that wet etching processes use a removal chemistry that effectively removes the correct material without adversely affecting an underlying layer. In other words, the removal chemistry is required to be selective.

Nickel silicide (NiSi) has been used in the fabrication of microelectronic substrates, such as complementary metal-oxide-semiconductor (CMOS) devices, to form stable ohmic contacts between silicon and metallic conductors. Platinum (Pt) can be added to the nickel (Ni) before silicide formation, commonly in an amount of 1-25% (atomic), to produce a nickel-platinum alloy (NiPt), to reduce resistivity and improve thermal stability and film morphology. A process can for example start with a patterned wafer with areas of exposed silicon. A blanket film of NiPt can be deposited on this structure and annealed at a high temperature (e.g., 250-350° C.). During this anneal, some of the NiPt reacts with the underlying silicon to form a NiPt silicide (NiPtSi). The unreacted NiPt is then removed with a wet etching step. In the regions where the silicon was not exposed, the full thickness of NiPt is removed, while in the regions where the silicon was exposed, the NiPt is removed but the NiPt silicide should remain. This results in the NiPt silicide being present only where the silicon was initially exposed. The process can also contain a second annealing step at high temperature (e.g., more than 400° C.) to ensure that a final stable low resistivity silicide is formed.

During the wet etching step to remove NiPt, it is important to limit etching of the desired NiPt silicide (NiPtSi) as well as any other materials which are desired to remain on the microelectronic substrate, such as for example exposed gate metals such as titanium nitride (TiN), aluminium (Al) or tungsten (W).

In this context there is a need for new methods and compositions for selectively removing NiPt from microelectronic substrates, for example in the presence of NiPt silicide and/or titanium nitride (TiN).

Accordingly, it is an object of the present invention to provide methods and compositions that selectively remove NiPt material from microelectronic substrates.

SUMMARY OF THE INVENTION

Aspects of the invention relate to methods of selectively removing material from microelectronic substrates by contact with an aqueous etching composition.

A first aspect of the invention provides a method of selectively removing NiPt material from a microelectronic substrate, the method comprising contacting the NiPt material with an aqueous etching composition comprising: an oxidising agent; a strong acid; and a source of chloride.

This method can achieve usefully high etch rates for removal of NiPt material. Usefully low etch rates for NiPt silicide and titanium nitride, such as may be present in the microelectronic substrate, can also be achieved.

A second aspect of the invention provides an aqueous etching composition comprising: an oxidising agent; a strong acid; and a source of chloride.

Furthermore, aspects of the invention relate to the use of aqueous etching compositions to achieve desired results.

A third aspect of the invention provides the use in an etching process of an aqueous etching composition comprising: an oxidising agent, a strong acid, and a source of chloride, for the purpose of achieving a higher etch rate of NiPt material compared to an etch rate of a NiPt silicide or TiN.

Particular embodiments of the invention can provide particular benefits in performance or customization, as set out in the detailed description below.

Features of each aspect of the invention may be as described in connection with any of the other aspects. Within the scope of this application it is expressly intended that the various aspects, embodiments, examples and alternatives set out herein, and in particular the individual features thereof, may be taken independently or in any combination. That is, all embodiments and/or features of any embodiment can be combined in any way and/or combination, unless such features are incompatible.

BRIEF DESCRIPTION OF THE DRAWINGS

The disclosure may be more completely understood in consideration of the following description of various illustrative embodiments in connection with the accompanying drawings FIG. 1 is Table 1 that portrays compositions for which the etch rates were studied.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

Various aspects of the invention relate to an aqueous etching composition comprising: an oxidising agent; a strong acid; and a source of chloride.

In accordance with this invention, the oxidising agent, strong acid and source of chloride are each different, i.e. are not the same as each other.

The composition may be used for selectively removing or etching material from a microelectronic substrate. Advantageous results have been achieved when removing NiPt material from the microelectronic substrate. The composition can also be used to remove other materials.

The term "microelectronic substrate" is used herein to include any substrate or structure that is or will eventually become a microelectronic device or microelectronic assembly. Non-limiting examples include semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications.

Microelectronic substrates often comprise metals, for example tungsten, cobalt, copper or ruthenium. Advantageously, the composition may be tailored to preserve such metals.

The term "NiPt material" is used herein to refer to compounds (alloys) in which nickel is combined with platinum. Such compounds may have any valid stoichiometry. In various embodiments, the NiPt material can have a Pt concentration of from 0.1% to 30% atomic, from 0.1% to 10%, from 1% to 25% atomic, or from 5% to 30% atomic. For example, NiPt with a Pt concentration of 25% atomic would correspond to the stoichiometric ratio of Ni:Pt being 75:25.

Throughout this specification, the term "NiPt material" can be used interchangeably with "NiPt", or "nickel-platinum alloy". It should be appreciated that the NiPt material can include other elements, for example, wherein the nickel is partially substituted by cobalt and/or the platinum is partially substituted by other noble metals (e.g., Pd, Rh, Ir, Ru, and Re). It should be appreciated that the NiPt material does not include NiPt silicide, which the composition described herein is not intended to remove.

In various embodiments, the composition may be used to selectively remove material (for example NiPt material) whilst minimizing etching of other materials. Non-limiting examples of materials for which etching may be advantageously minimised are NiPt silicide (NiPtSi) and metal materials, which may be metal gate materials, such as titanium nitride (TiN), silicon (Si) or tungsten (W). However, the composition may also be tailored to minimise etching of other materials.

The term "NiPt silicide" is used herein to refer to compounds resulting from the reaction of a NiPt material with silicon, resulting in a silicided NiPt material. The term "NiPt silicide" can be used interchangeably throughout this specification with "NiPt silicide material", "NiPtSi", or "NiPtSi material".

The composition comprises an oxidising agent. Suitably, the composition may comprise an oxidising agent component consisting of a plurality of oxidising agents.

In some embodiments the oxidising agents include, but are not limited to, hydrogen peroxide ($H_2O_2$), bromine, ozone, bubbled air, cyclohexylaminosulfonic acid, $FeCl_3$ (both hydrated and unhydrated), oxone ($2KHSO_5 \cdot KHSO_4 \cdot K_2SO_4$), oxone tetrabutylammonium salt, iodic acid, periodic acid, permanganic acid, chromium (III) oxide, ammonium cerium nitrate, methylmorpholine-N-oxide, trimethylamine-N-oxide, triethylamine-N-oxide, pyridine-N-oxide, N-ethylmorpholine-N-oxide, N-methylpyrrolidine-N-oxide, N-ethylpyrrolidine-N-oxide, nitroaromatic acids such as nitrobenzoic acids, ammonium polyatomic salts (e.g., ammonium peroxomonosulfate, ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), ammonium hypochlorite ($NH_4ClO$)), sodium polyatomic salts (e.g., sodium persulfate ($Na_2S_2O_8$), sodium hypochlorite (NaClO)), potassium polyatomic salts (e.g., potassium iodate ($KIO_3$), potassium permanganate ($KMnO_4$), potassium persulfate, potassium persulfate ($K_2S_2O_8$), potassium hypochlorite (KClO)), tetramethylammonium polyatomic salts (e.g., tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)S_2O_8$)), tetrabutylammonium polyatomic salts (e.g., tetrabutylammonium peroxomonosulfate), peroxomonosulfuric acid, ferric nitrate ($Fe(NO_3)_3$), urea hydrogen peroxide (($CO(NH_2)_2)H_2O_2$), peracetic acid ($CH_3(CO)OOH$), sodium nitrate, potassium nitrate, ammonium nitrate, nitric acid ($HNO_3$), sulfuric acid ($H_2SO_4$), chlorine, chlorine dioxide, organic peroxides (e.g., dicumyl peroxide, methyl-2,5-di(t-butyl-peroxy)hexane, dibenzoyl peroxide, 2,4-dichlorobenzyl peroxide, t-butylhydroperoxide, t-butyl perbenzoate), metal peroxides (e.g., $TiO_3$, $PbO_2$), and combinations thereof.

Suitably, the oxidising agents may include, but are not limited to, hydrogen peroxide ($H_2O_2$), ammonium persulfate (APS), urea hydrogen peroxide, and combinations thereof. Conveniently, an oxidising agent may be selected from hydrogen peroxide ($H_2O_2$) and ammonium persulfate (APS). Preferably, the oxidising agent comprises hydrogen peroxide ($H_2O_2$). More preferably, the oxidising agent is hydrogen peroxide ($H_2O_2$).

In various embodiments the composition comprises in the range of from 0.1 to 30 wt %, based on the total weight of the composition, of an oxidising agent or oxidising agent component as described anywhere herein. Suitably, the amount of oxidising agent or oxidising agent component may be in the range of from 0.1 to 20 wt %, from 0.1 to 15 wt %, from 0.1 to 10 wt %, from 0.1 to 5 wt %, or from 0.1 to 4 wt %. In an embodiment, the amount of oxidising agent or oxidising agent component may be from 1 to 15 wt %, from 1 to 10 wt %, from 1 to 5 wt %, or from 1 to 4 wt %. In an embodiment, the amount of oxidising agent or oxidising agent component may be less than 5 wt %. In an embodiment, the amount of oxidising agent or oxidising agent component may be about 3 wt %.

The oxidising agent or oxidising agent component may be the sole oxidising agent in the composition. In various embodiments the total amount of oxidising agent may be in the range of from 0.1 to 30 wt %, based on the total weight of the composition. Suitably, the total amount of oxidising agent may be in the range of from 0.1 to 20 wt %, from 0.1 to 15 wt %, from 0.1 to 10 wt %, from 0.1 to 5 wt %, or from 0.1 to 4 wt %. In an embodiment, the total amount of oxidising agent may be from 1 to 15 wt %, from 1 to 10 wt %, from 1 to 5 wt %, or from 1 to 4 wt %. In an embodiment, the total amount of oxidising agent may be less than 5 wt %. In an embodiment, the total amount of oxidising agent may be about 3 wt %.

The composition comprises a strong acid. Suitably, the composition may comprise a strong acid component consisting of a plurality of strong acids.

In some embodiments the strong acids include any acids which have a pKa value of less than 1.

In some embodiments the strong acids include, but are not limited to, sulfuric acid ($H_2SO_4$), sulfonic acids (e.g., alkylsulfonic acids), such as for example methanesulfonic acid (MSA), ethanesulfonic acid, 2-hydroxyethanesulfonic acid, n-propanesulfonic acid, isopropanesulfonic acid, isobutenesulfonic acid, n-butanesulfonic acid, n-octanesulfonic acid, benzenesulfonic acid, nitric acid ($HNO_3$), hydrochloric acid (HCl), hydrobromic acid, hydroiodic acid, perchloric acid, phosphoric acids, phosphonic acids (e.g., alkylphosphonic acids), such as for example 1-hydroxyethane 1,1-diphosphonic acid (HEDP), decylphosphonic acid, dodecylphosphonic acid (DDPA), tetradecylphosphonic acid, hexadecylphosphonic acid, bis(2-ethylhexyl)phosphate, octadecylphosphonic acid, and combinations thereof.

Suitably, the strong acids may include, but are not limited to, sulfonic acids (e.g., methanesulfonic acid (MSA)), sulfuric acid ($H_2SO_4$), nitric acid ($HNO_3$), hydrochloric acid (HCl), and combinations thereof. Preferably, a strong acid may be selected from methanesulfonic acid (MSA), sulfuric acid ($H_2SO_4$), nitric acid ($HNO_3$), and combinations thereof. More preferably, the strong acid comprises methanesulfonic acid (MSA), sulfuric acid ($H_2SO_4$), or combinations thereof, or the strong acid is methanesulfonic acid (MSA), sulfuric acid ($H_2SO_4$), or combinations thereof. Most preferably, the strong acid comprises methanesulfonic acid (MSA), or the strong acid is methanesulfonic acid (MSA).

In an embodiment, the strong acid may be a sulfur-containing acid, such as for example sulfuric acid ($H_2SO_4$) and/or sulfonic acids listed above, preferably sulfuric acid ($H_2SO_4$) and/or methanesulfonic acid (MSA).

In an embodiment, the composition is substantially devoid of nitric acid.

In various embodiments the composition comprises up to 50 wt %, based on the total weight of the composition, of a strong acid or a strong acid component as described anywhere herein. Suitably, the amount of strong acid or strong acid component may be up to 35 wt %, such as in the range of from 0.1 to 35 wt %, from 1 wt % to 30 wt %, from 1 wt % to 20 wt %, or from 5 to 15 wt %. In an embodiment, the amount of strong acid or strong acid component may be about 10 wt %, or about 11 wt %.

The strong acid or strong acid component may be the sole strong acid in the composition. In various embodiments the total amount of strong acid may be up to 50 wt %, based on the total weight of the composition. Suitably, the total amount of strong acid may be up to 35 wt %, such as in the range of from 0.1 to 35 wt %, from 1 wt % to 30 wt %, from 1 wt % to 20 wt %, or from 5 to 15 wt %. In an embodiment, the total amount of strong acid may be about 10 wt %, or about 11 wt %.

The composition comprises a source of chloride. Suitably, the composition may comprise a source of chloride component consisting of a plurality of sources of chloride.

In some embodiments the sources of chloride include, but are not limited to, hydrogen chloride (HCl), ammonium chloride ($NH_4Cl$), alkali metal chlorides, such as for example sodium chloride, lithium chloride, potassium chloride, alkali earth metal chlorides, and combinations thereof.

Preferably, the source of chloride may be selected from hydrogen chloride (HCl), ammonium chloride ($NH_4Cl$), and combinations thereof.

In various embodiments the composition comprises up to 40 wt %, based on the total weight of the composition, of a source of chloride or a source of chloride component as described anywhere herein. Suitably, the amount of source of chloride or source of chloride component may be in the range of from 0.1 to 30 wt %. In an embodiment, the amount of source of chloride or source of chloride component may be from 1 wt %, for example from 1 wt % to 20 wt %, from 1 to 10 wt %, from 1 to 6 wt %, or from 1 to 5 wt %. In an embodiment, the amount of source of chloride or source of chloride component may be about 1 wt %, about 2 wt %, about 3 wt %, about 4 wt %, about 5 wt %, or about 6 wt %.

The source of chloride or source of chloride component may be the sole source of chloride in the composition. In various embodiments the total amount of source of chloride may be up to 40 wt % based on the total weight of the composition. Suitably, the total amount of source of chloride may be in the range of from 0.1 to 30 wt %. In an embodiment, the total amount of source of chloride may be from 1 wt %, for example from 1 wt % to 20 wt %, from 1 to 10 wt %, from 1 to 6 wt %, or from 1 to 5 wt %. In an embodiment, the total amount of source of chloride may be about 1 wt %, about 2 wt %, about 3 wt %, about 4 wt %, about 5 wt %, or about 6 wt %.

The oxidising agent or oxidising agent component, the strong acid or strong acid component, and the source of chloride or source of chloride component, are different from each other. This means that the aqueous etching composition, in addition to water, must contain at least three different compounds or components, the first of which functions as an oxidising agent, the second of which functions as a strong acid, and the third of which functions as a source of chloride. For example, if the composition contains HCl, this compound can function as a strong acid or a source of chloride, but another strong acid or source of chloride would also have to be present (as well as an oxidising agent).

In an embodiment, the ratio of the (a) oxidising agent or oxidising agent component to the (b) strong acid or strong acid component can be for example be: (a):(b) is from 5:1 to 1:5, or from 4:1 to 1:4, or from 3:1 to 1:3, or from 2:1 to 1:2, or from 1:1 to 1:5, or for example about 1:5, or about 1:4, or about 1:3, or about 1:2, or about 1:1, or about 2:1, or about 3:1, or about 4:1, or about 5:1.

Suitably, the ratio of the (a) oxidising agent or oxidising agent component to the (c) source of chloride or source of chloride component can be for example be: (a):(c) is from 5:1 to 1:5, or from 4:1 to 1:4, or from 3:1 to 1:3, or from 2:1 to 1:2, or for example about 1:5, or about 1:4, or about 1:3, or about 1:2, or about 1:1, or about 2:1, or about 3:1, or about 4:1, or about 5:1.

Suitably, the ratio of the (b) strong acid or strong acid component to the (c) source of chloride or source of chloride component can be for example be: (b):(c) is from 5:1 to 1:5, or from 4:1 to 1:4, or from 3:1 to 1:3, or from 2:1 to 1:2, or for example about 1:5, or about 1:4, or about 1:3, or about 1:2, or about 1:1, or about 2:1, or about 3:1, or about 4:1, or about 5:1.

Suitably, the ratio of the (a) oxidising agent or oxidising agent component, (b) strong acid or strong acid component, and (c) source of chloride or source of chloride component, may for example be: (a):(b):(c) is about 2:2:1, or about 1:2:1.

The composition may have a pH in the range of from −1 to 3. Advantageously, the pH may be in the range of from −1 to 2, or from −1 to 1, or from −0.5 to 1.

The composition is aqueous and therefore comprises water which acts as a solvent. Suitably, water may make up a balancing amount of the composition.

In various embodiments, the concentration of solvent in the composition is in a range from 10 wt % to 99 wt %, for example in a range from 40 wt % to 95 wt %, from 50 wt % to 95 wt %, from 60 wt % to 95 wt %, from 70 wt % to 95 wt %, from 40 wt % to 90 wt %, from 50 wt % to 90 wt %, from 60 wt % to 90 wt %, %, from 70 wt % to 90 wt %, from 40 wt % to 85 wt %, from 50 wt % to 85 wt %, from 60 wt % to 85 wt %, from 70 wt % to 85 wt %, from 40 wt % to 80 wt %, from 50 wt % to 80 wt %, from 60 wt % to 80 wt %, or from 70 wt % to 80 wt %.

Suitably, the solvent in the composition may comprise or consist of water.

In various embodiments, the concentration of water in the composition is in a range from 10 wt % to 99 wt %, for example in a range from 40 wt % to 95 wt %, from 50 wt % to 95 wt %, from 60 wt % to 95 wt %, from 70 wt % to 95 wt %, from 40 wt % to 90 wt %, from 50 wt % to 90 wt %, from 60 wt % to 90 wt %, %, from 70 wt % to 90 wt %, from 40 wt % to 85 wt %, from 50 wt % to 85 wt %, from 60 wt % to 85 wt %, from 70 wt % to 85 wt %, from 40 wt % to 80 wt %, from 50 wt % to 80 wt %, from 60 wt % to 80 wt %, or from 70 wt % to 80 wt %.

Optionally, the composition can further include at least one additional species selected from the group consisting of an organic solvent, a complexing agent, a corrosion inhibitor, a surfactant, a sugar alcohol, a monosaccharide, a pH adjustor, and combinations thereof.

In addition to water, the composition may comprise an organic solvent. Suitably, the composition may comprise an organic solvent component consisting of a plurality of organic solvents. Suitably, the organic solvents may comprise one or more water-miscible organic solvents. In some embodiments the organic solvents include, but are not limited to, (primary or secondary) alcohols, alkylenes, silyl halides, carbonates (e.g., alkyl carbonates, alkylene carbonates, etc.), glycols, glycol ethers, hydrocarbons, hydrofluorocarbons, and combinations thereof, such as straight-chained or branched methanol, ethanol, isopropanol, butanol, pentanol, hexanol, 2-ethyl-l-hexanol, heptanol, octanol, and higher alcohols (including diols, triols, etc.), 4-methyl-2-pentanol, ethylene glycol, propylene glycol, butylene glycol, butylene carbonate, ethylene carbonate, propylene carbonate, dipropylene glycol, ureas, ethers, glycol ethers (e.g., diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether), 2,3-dihydrodecafluorpentane, ethyl perfluorobutyl ether, methyl perfluorobutyl ether, and combinations thereof. The nature of the solvent can be tailored to desired applications.

In an embodiment, the composition is substantially devoid of organic solvents.

The composition may optionally comprise a complexing agent. Complexing agents may be substantially devoid of chloride. Complexing agents contemplated herein include, but are not limited to, β-diketonate compounds such as acetylacetonate, 1,1,1-trifluoro-2,4-pentanedione, and 1,1,1,5,5,5-hexafluoro-2,4-pentanedione; carboxylates such as formate and acetate and other long chain carboxylates; amides, such as bis(trimethylsilylamide) tetramer, amines, amino acids (i.e. glycine, serine, proline, leucine, alanine, asparagine, aspartic acid, glutamine, valine, and lysine), citric acid, acetic acid, maleic acid, oxalic acid, malonic acid, succinic acid, phosphonic acid, phosphonic acid derivatives such as hydroxyethylidene diphosphonic acid (HEDP), 1-hydroxyethane-1,1-diphosphonic acid, nitrilotris(methylenephosphonic acid), iminodiacetic acid (IDA), etidronic acid, ethylenediamine, ethylenediaminetetraacetic acid (EDTA), and (1,2-cyclohexylenedinitrilo)tetraacetic acid (CDTA), uric acid, tetraglyme, pentamethyldiethylenetriamine (PMDETA), 1,3,5-triazine-2,4,6-thithiol trisodium salt solution, 1,3,5-triazine-2,4,6-thithiol triammonium salt solution, sodium diethyldithiocarbamate, disubstituted dithiocarbamates ($R^1(CH_2CH_2O)_2NR^2CS_2Na$) with one alkyl group ($R^2$=hexyl, octyl, deceyl or dodecyl) and one oligoether ($R^1(CH_2CH_2O)_2$, where $R^1$=ethyl or butyl), ammonium sulfate, monoethanolamine (MEA), Dequest 2000, Dequest 2010, Dequest 2060s, diethylenetriamine pentaacetic acid, propylenediamine tetraacetic acid, 2-hydroxypyridine 1-oxide, ethylendiamine disuccinic acid (EDDS), N-(2-hydroxyethyl)iminodiacetic acid (HEIDA), sodium triphosphate penta basic, sodium and ammonium salts thereof, dimethylglyoxime, ammonium bromide, and combinations thereof. Preferably, the complexing agent may comprise citric acid.

In an embodiment, the composition is substantially devoid of complexing agents.

The composition may optionally comprise a corrosion inhibitor. Corrosion inhibitors contemplated herein include, but are not limited to, ascorbic acid, adenosine, L(+)-ascorbic acid, isoascorbic acid, ascorbic acid derivatives, ethylenediamine, gallic acid, oxalic acid, tannic acid, aspartic acid, ethylenediaminetetraacetic acid (EDTA), uric acid, 1,2,4-triazole (TAZ), triazole derivatives (e.g., benzotriazole (BTA), tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), 4-Amino-4H-1,2,4-triazole (ATAZ), naphthotriazole), 2-mercaptobenzimidazole (MBI), 2-ethyl-4-methylimidazole, 2-mercaptobenzothiazole, 4-methyl-2-phenylimidazole, 2-mercaptothiazoline, 5-aminotetrazole (ATA), 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, mercaptobenzimidazole, 4-methyl-4H-1,2,4-triazole-3-thiol, 5-amino-1,3,4-thiadiazole-2-thiol, benzothiazole, tritolyl phosphate, imidazole, indiazole, benzoic acid, boric acid, malonic acid, ammonium benzoate, catechol, pyrogallol, resorcinol, hydroquinone, cyanuric acid, barbituric acid and derivatives such as 1,2-dimethylbarbituric acid, alpha-keto acids such as pyruvic acid, adenine, purine, phosphonic acid and derivatives thereof, glycine/ascorbic acid, Dequest 2000, Dequest 7000, p-tolylthiourea, succinic acid, phosphonobutane tricarboxylic acid (PBTCA), benzylphosphonic acid, and combinations thereof.

Additional or alternative corrosion inhibitors contemplated herein include, but are not limited to, compounds having the general formula $R^1R^2NC(=NR^3)(NR^4)(CH_2)_nC(NR^5R^6)R^7R^8$, where $R^1$, $R^2$, $R^3$, $R^4$, $R^5$, $R^6$, $R^7$ and $R^8$ can be the same as or different from each other and are selected from to the group consisting of hydrogen, $C_1$-$C_{30}$ alkyls, $C_2$-$C_{30}$ alkenes, cycloalkyls, $C_1$-$C_{30}$ alkoxys, $C_1$-$C_{30}$ carboxyls, and combinations thereof, and n is an integer from 1-6 such as arginine.

Cationic surfactants are also contemplated as additional or alternative corrosion inhibitors including, but not limited to, heptadecanefluorooctane sulfonic acid tetraethylammonium, stearyl trimethylammonium chloride (Econol TMS-28, Sanyo), 4-(4-diethylaminophenylazo)-1-(4-nitrobenzyl) pyridium bromide, cetylpyridinium chloride monohydrate, benzalkonium chloride, benzethonium chloride, benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis(decyl)ammonium bromide, Aliquat® 336, oxyphenonium bromide, guanidine hydrochloride (C(NH2)3Cl), triflate salts such as tetrabutylammonium trifluoromethanesulfonate, and combinations thereof. The hydrocarbon groups preferably have at least 10, e.g., 10-20, carbon atoms (e.g., decyl, undecyl, dodecyl, tridecyl, tetradecyl, pentadecyl, hexadecyl, heptadecyl, octadecyl, nonadecyl, eicosyl), except that somewhat shorter hydrocarbon groups of 6-20 carbons (e.g., hexyl, 2-ethylhexyl, dodecyl) are preferred where the molecule contains two functionalized alkyl chains such as in dimethyldioctadecylammonium chloride, dimethyldihexadecylammonium bromide and di(hydrogenated tallow)dimethylammonium chloride (e.g., Arquad 2HT-75, Akzo Nobel).

Additional or alternative corrosion inhibitors contemplated herein include, but are not limited to, carboxylic acids with formula $(R^1)_{3-m}N[(CH_2)_nC(=O)OH]_m$, where $R^1$ includes groups selected from, but not limited to, hydrogen, alkyls, carboxylic groups, amido groups and combinations thereof, n is an integer from 1-6, and m is an integer from 1-3, such as iminoacetic acid, iminodiacetic acid, N-(2-acetamido)iminodiacetic acid, and nitrilotriacetic acid, and combinations thereof.

Any of the optional corrosion inhibitors listed above may be used in any combination.

In an embodiment, the composition is substantially devoid of corrosion inhibitors.

The composition may optionally comprise a surfactant. Contemplated cationic surfactants are set out above.

The composition may optionally comprise a non-ionic surfactant. Non-ionic surfactants contemplated include, but are not limited to, polyoxyethylene lauryl ether (Emalmin NL-100 (Sanyo), Brij 30, Brij 98), dodecenylsuccinic acid monodiethanol amide (DSDA, Sanyo), ethylenediamine tetrakis (ethoxylate-block-propoxylate) tetrol (Tetronic 90R4), polyoxyethylene polyoxypropylene glycol (Newpole PE-68 (Sanyo), Pluronic L31, Pluronic 31R1), polyoxypropylene sucrose ether (SN008S, Sanyo), t-octylphenoxypolyethoxyethanol (Triton X100), Polyoxyethylene (9) nonylphenylether, branched (IGEPAL CO-250), polyoxyethylene sorbitol hexaoleate, polyoxyethylene sorbitol tetraoleate, polyethylene glycol sorbitan monooleate (Tween 80), sorbitan monooleate (Span 80), alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives such as SIS6952.0 (Siliclad, Gelest), siloxane modified polysilazane such as PP1-SG10 Siliclad Glide 10 (Gelest), silicone-polyether copolymers such as Silwet L-77 (Setre Chemical Company), Silwet ECO Spreader (Momentive), alcohol ethoxylates (NatsurfrM 265, Croda), and combinations thereof.

In an embodiment, the composition is substantially devoid of surfactants, substantially devoid of ionic surfactants, substantially devoid of cationic surfactants, substantially devoid of anionic surfactants, and/or substantially devoid of non-ionic surfactants.

The composition may optionally comprise a sugar alcohol. Sugar alcohols contemplated herein include, but are not limited to, erythritol, xylitol, mannitol, sorbitol, glycerol, maltitol, and combinations thereof.

In an embodiment, the composition is substantially devoid of sugar alcohols.

The composition may optionally comprise a monosaccharide or polysaccharide. Monosaccharides and polysaccharides contemplated herein include, but are not limited to, glucose, fructose, ribose, mannose, galactose, sucrose, lactose, raffinose, and combinations thereof.

In an embodiment, the composition is substantially devoid of monosaccharides and/or polysaccharides.

The composition may optionally comprise a pH adjustor to ensure the desired pH range is achieved. A pH adjustor may be of any suitable type, such as for example a pH buffering agent.

In an embodiment, the composition is substantially devoid of pH adjustors.

In an embodiment, the composition is substantially devoid of iodine or iodide species.

In various embodiments, the composition may consist of or consist essentially of an oxidising agent, a strong acid, a source of chloride, and water, which may each be as further defined elsewhere herein and may make up an amount as defined elsewhere herein. The amount of water may be a balancing amount of water.

The composition may be embodied in a wide variety of specific formulations, as obtainable by combining any of the defined components herein.

In various embodiments, the composition comprises the following combination of constituents (which may each be as further defined elsewhere herein and may make up an amount as defined elsewhere herein):
    an oxidising agent, optionally hydrogen peroxide;
    a strong acid, optionally methanesulfonic acid; and
    a source of chloride, optionally hydrogen chloride or ammonium chloride.

The composition may also include further components where desired, which may each be as further defined elsewhere herein and may make up an amount as defined elsewhere herein.

The invention also embraces a method of selectively removing material from a microelectronic substrate, the method comprising contacting the material with an aqueous etching composition as described anywhere herein.

Various aspects of the invention relate to a method of selectively removing NiPt material from a microelectronic substrate, the method comprising contacting the material with an aqueous etching composition comprising: an oxidising agent; a strong acid; and a source of chloride.

It will be appreciated that it is common practice to make concentrated forms of the composition to be diluted prior to use. For example, the composition may be manufactured in a concentrated form and thereafter diluted with at least one solvent at the manufacturer, before use, and/or during use. Dilution ratios may be in a range from about 0.1 part diluent:1 part composition concentrate to about 100 parts diluent:1 part composition concentrate.

In an embodiment, the aqueous etching composition is diluted with a diluent, optionally water.

The method may be performed at any suitable temperature. Optionally, the temperature may be in the range of from 15 to 100° C., from 30 to 80° C., preferably from 20 to 50° C., or from 25 to 40° C.

The method may involve contacting the composition with the microelectronic device for any suitable amount of time. Optionally, device may be contacted with the composition for a time of from 10 seconds to 180 minutes, preferably from 1 minute to 5 minutes.

Such contacting times and temperatures are illustrative, and any other suitable time and temperature conditions may be employed that are efficacious to at least partially remove the NiPt material from the microelectronic device, within the broad practice of the method.

The composition may be used in methods of the invention to achieve particular etch rates or particular etch ratios.

In various embodiments a NiPt etch rate of at least 100 Angstroms/minute, at least 500 Angstroms/minute, or even at least 800 Angstroms/minute is achieved, optionally in a NiPt etch test as defined below.

In various embodiments a NiPt silicide etch rate of at most 10 Angstroms/minute, or even at most 5 Angstroms/minute is achieved, optionally in a NiPt silicide etch test as defined below.

In various embodiments a TiN etch rate of at most 20 Angstroms/minute, or even at most 5 Angstroms/minute is achieved, optionally in a TiN etch test as defined below.

In various embodiments, the etch rate ratio between NiPt and NiPt silicide is at least 40:1, or advantageously at least 50:1 or 100:1.

In various embodiments, the etch rate ratio between NiPt and TiN is at least 40:1, or advantageously at least 50:1 or 100:1.

Various aspects of the invention relate to the use in an etching process of an aqueous etching composition as described anywhere herein, for the purpose of achieving a higher etch rate of NiPt compared to an etch rate of a NiPt silicide or TiN.

Throughout this specification, the words "comprise" and "contain" and variations of the words, for example "comprising" and "comprises", mean "including but not limited to", and do not exclude other components, integers or steps. However, wherever the word "comprising" is used, an embodiment in which "comprising" is read as "consisting of" or "consisting essentially of" is also explicitly embraced.

"Substantially devoid" is defined throughout this specification as less than 1 wt %, preferably less than 0.5 wt %, more preferably less than 0.1 wt %, even more preferably less than 0.05 wt % or less than 0.01 wt %, and most preferably 0 wt %.

Throughout this specification the singular encompasses the plural unless the context otherwise requires: in particular, where the indefinite article is used, the specification is to be understood as contemplating plurality as well as singularity, unless the context requires otherwise. The following non-limiting examples are provided by way of illustration only.

EXAMPLES

Referring to FIG. 1, the formulations are in Table 1 were prepared. The following abbreviations are used in Table 1. All amounts of components are in wt %.

MSA is methanesulfonic acid
APS is ammonium persulfate
IDA is iminodiacetic acid
30% $H_2O_2$ is 30 wt % $H_2O_2$ in water
70% $HNO_3$ is 70 wt % $HNO_3$ in water
35% HCl is 35 wt % HCl in water Referring to FIG. 1, Etch rates of the compositions in Table 1 were studied. In each of the etch rate tests a coupon of the relevant material was inserted into the composition at a predetermined temperature for the times indicated in the table. The extent of etching that occurred was measured by XRF (ZSX-400 from Rigaku Co.).

Referring to FIG. 1, Table 1 shows etch results for various compositions and temperatures.

The results show that usefully high etch rates for removal of NiPt material can be achieved by embodiments of the invention.

Usefully low etch rates for NiPtSi and TiN, such as may be present in the microelectronic substrate, can also be achieved.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. Changes may be made in detail, particularly in matters of shape, size, and arrangement of parts without exceeding the scope of the disclosure. The disclosure's scope is, of course, defined in the language in which the appended claims are expressed.

The invention claimed is:

1. A method of selectively removing NiPt material from a microelectronic substrate including NiPt and NiPt silicide, the method comprising;
   i) contacting the NiPt material with an aqueous etching composition comprising:
      from 0.1 to 5 wt %, based on the total weight of the composition, of an oxidizing agent component, wherein the oxidizing agent component is hydrogen peroxide ($H_2O_2$);
      from 1 wt % to 20 wt %, based on the total weight of the composition, of a strong acid component selected from the group consisting of sulfuric acid, methanesulfonic acid, and combinations thereof;
      from 1 wt % to 6 wt %, based on the total weight of the composition, of a source of chloride component selected from the group consisting of ammonium chloride, HCl, and combinations thereof; and
      from 70 to 95 wt %, based on the total weight of the composition, of water,
   wherein the strong acid component and the source of chloride component are present in a ratio of 5:1 to 1:5,
   wherein the oxidizing agent component and strong acid component are present in a ratio of 5:1 to 1:5, and
   wherein the oxidizing agent component and source of chloride component are present in a ratio of 5:1 to 1:5; and
   ii) selectively removing the NiPt relative to the NiPt silicide with a NiPt etch rate of at least 100 Å/min, a NiPt silicide etch rate of at most 10 Å/min, and with a selectivity ratio of at least 40:1.

2. The method of claim 1, wherein the amount of the oxidizing agent component in the composition is from 0.1 to 4 wt % based on the total weight of the composition.

3. The method of claim 1, wherein the strong acid component is sulfuric acid.

4. The method of claim 1, wherein the strong acid component is methanesulfonic acid.

5. The method of claim 1, wherein the amount of the strong acid component in the composition is from 5 to 15 wt % based on the total weight of the composition.

6. The method of claim 1, wherein the amount of the strong acid component in the composition is about 10 wt % or 11 wt %.

7. The method of claim 1, wherein the source of chloride component is hydrogen chloride (HCl).

8. The method of claim 1, wherein the source of chloride component is ammonium chloride.

9. The method of claim 1, wherein the amount of the source of chloride component in the composition is in the range of from 1 to 5 wt % based on the total weight of the composition.

10. The method of claim 1, wherein the microelectronic substrate further comprises TiN and wherein contacting the NiPt material with the aqueous etching composition further selectively removes the NiPt relative to the TiN with a selectivity ratio of at least 40:1.

11. The method of claim 1, wherein the composition comprises less than 1 wt % nitric acid.

* * * * *